(12) United States Patent
Hilt et al.

(10) Patent No.: US 11,812,621 B2
(45) Date of Patent: Nov. 7, 2023

(54) THREE TERMINAL TANDEM SOLAR GENERATION UNIT

(71) Applicants: TOTAL SE, Courbevoie (FR); ELECTRICITE DE FRANCE, Paris (FR); CENTRE NATIONAL DE LA RECHERCHE SCIENTIFIQUE, Paris (FR); ECOLE POLYTECHNIQUE, Palaiseau (FR); INSTITUT PHOTOVOLTAIQUE D'ILE DE FRANCE, Palaiseau (FR); L'AIR LIQUIDE SOCIETE ANONYME, Paris (FR)

(72) Inventors: Florian Hilt, Issy les Moulineaux (FR); Philip Schulz, Massy (FR); Etienne Drahi, Paris (FR)

( * ) Notice: Subject to any disclaimer, the term of this patent is extended or adjusted under 35 U.S.C. 154(b) by 0 days.

(21) Appl. No.: 17/415,692

(22) PCT Filed: Dec. 16, 2019

(86) PCT No.: PCT/EP2019/085326
§ 371 (c)(1),
(2) Date: Jun. 17, 2021

(87) PCT Pub. No.: WO2020/127030
PCT Pub. Date: Jun. 25, 2020

(65) Prior Publication Data
US 2022/0045130 A1 Feb. 10, 2022

(30) Foreign Application Priority Data

Dec. 20, 2018 (EP) .................................. 18306778

(51) Int. Cl.
*H10K 30/57* (2023.01)
*H01L 31/0475* (2014.01)
(Continued)

(52) U.S. Cl.
CPC ..... *H10K 30/57* (2023.02); *H01L 31/022433* (2013.01); *H01L 31/022441* (2013.01); *H01L 31/0475* (2014.12); *H01L 31/078* (2013.01)

(58) Field of Classification Search
CPC ......... H01L 31/0475; H01L 31/022433; H01L 31/022441
See application file for complete search history.

(56) References Cited

FOREIGN PATENT DOCUMENTS

| CN | 106410039 | 2/2017 | |
|---|---|---|---|
| WO | 2017105247 | 6/2017 | |
| WO | WO-2017105247 A1 * | 6/2017 | ........... H01L 27/302 |

OTHER PUBLICATIONS

An Office Action dated Apr. 29, 2023, which issued during the prosecution of Chinese Patent Application No. 201980084478.8.
(Continued)

*Primary Examiner* — Tae-Sik Kang
(74) *Attorney, Agent, or Firm* — McDonnell Boehnen Hulbert & Berghoff LLP (57) ABSTRACT

The present invention refers to a three terminal tandem solar generation unit (1) comprising: —a first absorbing layer (7) made of a perovskite type compound, —a second absorbing layer (11, 11'), —a first and a second interdigitated front contacts (5a, 5b) arranged on the front side of the first absorbing layer (7), the first front contact (5a) having a first polarity and the second front contact (5b) having a second polarity, —a back contact (17, 17') having the first or the second polarity arranged on the back side of the second absorbing layer (11, 11'), —an interface layer (9, 90, 9', 90') arranged between the first (7) and the second (11, 11') absorbing layers comprising a first semiconductor sub-layer (9a, 90a, 9a', 90a') doped according to the first polarity and a second sub-layer (9b, 90b, 9b', 90b') doped according to the second polarity and configured for enabling carriers associated with a polarity different than the polarity of the (Continued)

back contact (17, 17') to be transferred from the second absorbing layer (11, 11') to the first absorbing layer (7) to be collected by the front contact (5*a*, 5*b*) having a polarity different than the polarity of the back contact (17, 17').

12 Claims, 7 Drawing Sheets

(51) Int. Cl.
*H01L 31/0224* (2006.01)
*H01L 31/078* (2012.01)

(56) References Cited

OTHER PUBLICATIONS

Letter regarding ffice Action dated Apr. 29, 2023, which issued during the prosecution of Chinese Patent Application No. 201980084478.8.

\* cited by examiner

THREE TERMINAL TANDEM SOLAR GENERATION UNIT

CROSS REFERENCE TO RELATED APPLICATION

This application is a U.S. National Phase of International Application No. PCT/EP2019/085326, filed Dec. 16, 2019, which claims priority to European Patent Application No. 18306778.4, filed Dec. 20, 2018, both of which are incorporated by reference herein in their entirety.

BACKGROUND OF THE INVENTION

The present invention refers to photovoltaic energy production and in particular a solar generation unit enabling the conversion of the solar energy into electricity.

With climate change, global warming and the fossil fuel depletion, many technologies have been developed over the past few years in order to use alternate resources and in particular renewable energy resources.

One of the main technologies refers to the use of photovoltaic cells to convert the solar energy into electricity.

A solar cell comprises a P-N junction wherein light is absorbed to create electron-hole pairs and opposite electrodes to collect the electrons on one side and the holes on the other side.

In order to improve the efficiency of the solar cells, one way is to stack several solar cell to form a multi-contact or tandem solar cells.

Different types of tandem solar cells have been developed but some drawbacks appear for each configuration. For example, a two terminal (2T) configuration requires current matching due to subcells connected in series and four terminal (4T) configuration induces more layers and therefore a higher cost and may introduce additional parasitic losses.

Three terminal (3T) configuration seems to reduce the drawbacks offered by the 2T and 4T terminals. However, 3T configuration usually requires an interdigitated back contact (IBC) which prevents the use of low cost passivated emitter and rear cell (PERC) of mass production as it requires a high quality material, for example n-type material with long diffusion length.

The present invention aims therefore at providing a solar generation unit providing a high efficiency while limiting the manufacturing cost of such solar generation unit.

SUMMARY OF THE INVENTION

The present invention refers to a Three terminal tandem solar generation unit comprising:
- a first absorbing layer made of a compound having a perovskite type crystalline structure and comprising a front side and a back side,
- a second absorbing layer comprising a front side and a back side,
- a first and a second interdigitated front contacts arranged on the front side of the first absorbing layer, the first front contact having a first polarity and the second front contact having a second polarity,
- a back contact having the first or the second polarity arranged on the back side of the second absorbing layer,
- an interface layer arranged between the first and the second absorbing layers comprising a first semiconductor sub-layer doped according to the first polarity and a second sub-layer doped according to the second polarity and configured for enabling carriers associated with a polarity different than the polarity of the back contact to be transferred from the second absorbing layer to the first absorbing layer to be collected by the front contact having a polarity different than the polarity of the back contact.

According to another aspect of the invention, the interface layer is a tunnel junction layer.

According to a further aspect of the invention, the interface layer is a recombination layer made of two sublayers of transparent conductive oxides.

According to an additional aspect of the invention, the second absorbing layer is made of crystalline silicon.

According to another aspect of the invention, the second absorbing layer is made of one alloy among the following alloys:
- a III-V semiconductor alloy,
- a compound having a perovskite type crystalline structure,
- Copper Indium Gallium Selenide "CIGS",
- Cadmium Telluride "CdTe".

According to a further aspect of the invention, the first polarity corresponds to the p-type polarity having holes as associated carriers and the second polarity corresponds to the n-type polarity having electrons as associated carriers.

According to an additional aspect of the invention, the back contact has the first polarity and comprises a back surface field and the second absorbing layer is doped according to the first polarity.

According to another aspect of the invention, the tunnel junction comprises a sub-layer highly doped according to the first polarity and arranged in contact of the front side of the second absorbing layer and a sublayer doped according to the second polarity and arranged in contact of the back side of the first absorbing layer.

According to a further aspect of the invention, the back contact has the second polarity and the second absorbing layer is doped according to the second polarity.

According to an additional aspect of the invention, the tunnel junction comprises a sub-layer highly doped according to the second polarity and arranged in contact of the front side of the second absorbing layer and a sublayer doped according to the first polarity and arranged in contact of the back side of the first absorbing layer.

According to another aspect of the invention, the front and back contacts are passivated contacts.

According to a further aspect of the invention, the first and the second front contacts comprise respectively a Hole Transport Layer "HTL" and an Electron Transport Layer "ETL".

According to another aspect of the invention, the hole transport layer is made of one among:
- Nickel oxide "$NiO_x$",
- Mobyldenum oxide "$MoO_x$",
- Tungsten oxide "$WO_x$",
- 2,2',7,7'-Tetrakis-(N,N-di-4-methoxyphenylamino)-9,9'-spirobifluorene "Spiro-OMeTAD",
- poly(triarylamine) "PTAA",
- poly(3-hexylthiophene) "P3HT",
- poly(3,4-ethylenedioxythiophene) doped with poly(styrene sulfonate) "PEDOT:PSS",
- Copper(I) thiocyanate "CuSCN",
- Cobalt oxide "$CoO_x$",
- Chromium oxide "$CrO_x$",
- Copper(I) iodide "CuI",
- Copper sulfide "CuS",
- Copper oxide "$CuO_x$", Vanadium oxide "$VO_x$",
and the electron transport layer is made of one among:
Tin oxide "$SnO_x$",
Titanium oxide "$TiO_x$",
Zinc oxide "$ZnO_x$,"
carbon, $C_{60}$ and derivatives
Zirconia "$ZrO_x$"
graphite
graphene
graphene oxide "rGO".

According to an additional aspect of the invention, the front and back contacts comprise a metallic grid or a transparent conductive oxide grid.

The present invention also refers to a manufacturing process of a three terminal tandem solar generation unit comprising the following steps:
  providing a light transparent substrate having a back face and a front face,
  depositing a back contact having a first or a second polarity on the front face of the substrate,
  depositing a second absorbing layer on the back contact,
  depositing a first highly doped semi-conductive sub-layer of a tunnel junction on the second absorbing layer,
  depositing a second doped semi-conductive sub-layer of the tunnel junction on the first sub-layer,
  depositing a first absorbing layer made of a compound having a perovskite type crystalline structure on the second sublayer,
  depositing a first and a second interdigitated front contacts on the first absorbing layer, the first front contact having a first polarity and the second front contact having a second polarity.

The present invention also refers to a manufacturing process of a three terminal tandem solar generation unit comprising the following steps:
  providing a crystalline silicon based photovoltaic cell comprising a crystalline silicone layer comprising a front side configured to be the side by which the light impinges the crystalline silicone layer and a back side opposite to the front side, a first set of layers arranged on the back side of the crystalline silicone layer and a second set of layers arranged on the front side of the crystalline silicone layer,
  removing the second set of layers of the crystalline silicon photovoltaic cell,
  depositing a first highly doped semi-conductive sub-layer of a tunnel junction on the front side of the crystalline silicon layer,
  depositing a second doped semi-conductive sub-layer of the tunnel junction on the first sub-layer,
  depositing a first absorbing layer made of a compound having a perovskite type crystalline structure on the second sublayer,
  depositing a first and a second interdigitated front contacts on the first absorbing layer, the first front contact having a first polarity and the second front contact having a second polarity.

According to another aspect of the invention, the step of removing the second set of layers comprises an etching step and/or a polishing step using hydrofluoric acid or a mix of hydrofluoric acid and nitric acid.

The present invention also refers to a method for functioning a three terminal tandem solar generation unit wherein the current generated between the first and the second interdigitated front contacts is adjusted so that the current generated by the first absorbing layer matches with the current generated by the second absorbing layer.

DETAILED DESCRIPTION OF THE INVENTION

The following achievements are examples. Although, the specification refers to one or several embodiments, it does not imply that each reference refers to the same embodiment or that the features apply only to a single embodiment. Simple features of different embodiments can also be combined to provide other embodiments.

The present invention refers to a tandem solar generation unit comprising three terminal. Such tandem cells comprise two different absorbing layers having two different bandgaps and configured for absorbing different parts of the light spectrum which are arranged in series. The three terminals are obtained by the use of two interdigitated contacts having two different polarizations on one side of the tandem solar generation unit. In the present case, the interdigitated contacts are arranged in the front side of the tandem solar generation unit which enables using standard existing cells as back cell of the tandem solar generation unit. Furthermore, one of the absorbing layer is made of a compound having a perovskite type crystalline structure which provides high efficiency for a limited cost.

Figure 1:
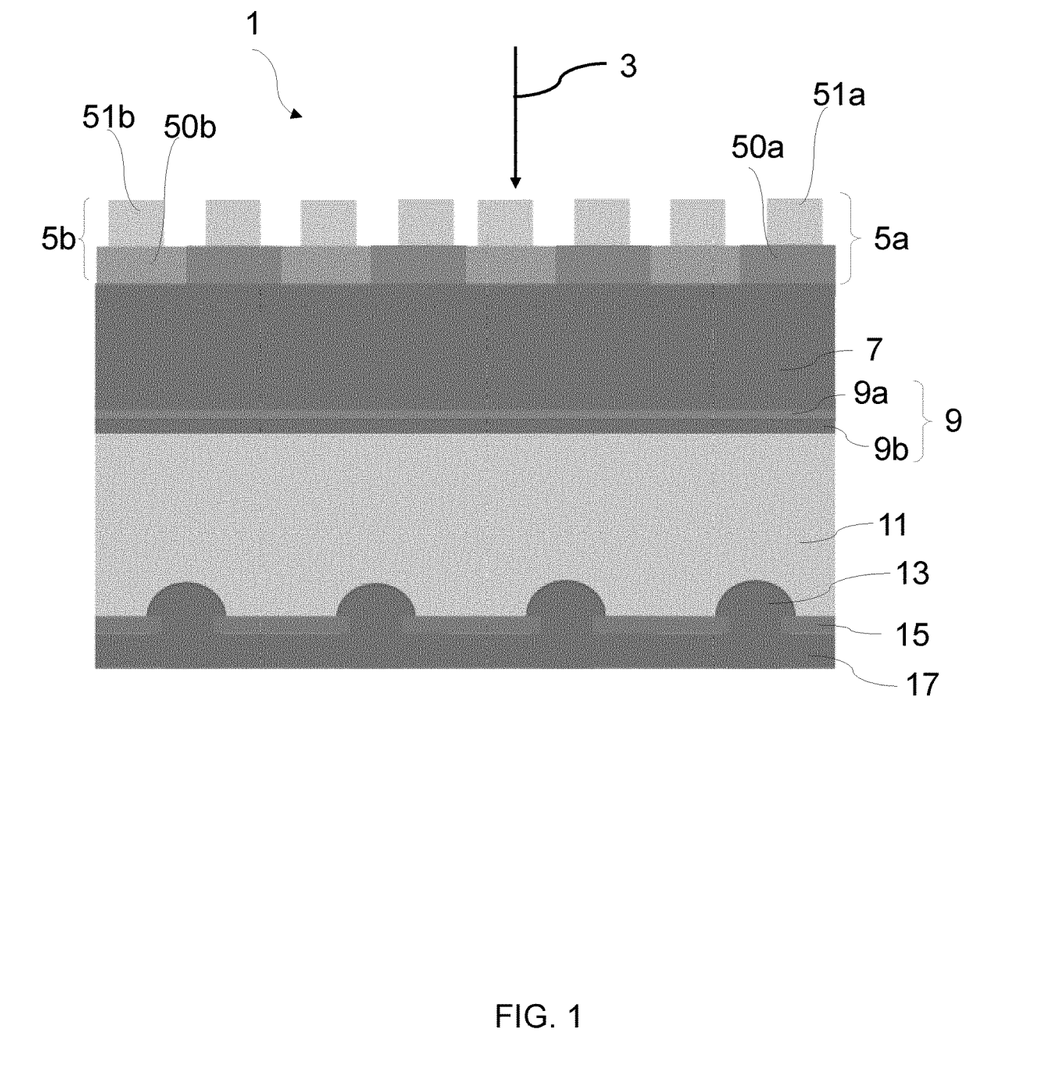
FIG. 1 is a diagram of a three terminal tandem solar generation unit according to a first embodiment of the invention.

FIG. 1 represents the different layer of a tandem solar generation unit 1 according to a first embodiment of the present invention. The arrow 3 represents the direction of incidence of light. The font side of the layers correspond to the side which is first impinged by the light. Accordingly, light reaches a front layer first with respect to a back layer.

The tandem solar generation unit 1 comprises the following layers:
  interdigitated front contacts 5a and 5b,
  a first absorbing layer 7,
  an interface layer 9 arranged on the back side of the first absorbing layer 7,
  a second absorbing layer 11 arranged on the back side of the interface layer 9,
  a back surface field layer 13,
  a passivation layer 15,
  a back contact layer 17.

The possible composition of the different layers will now be described in more details.

The interdigitated front contacts 5a, 5b may be made by two interleaved combs 50a, 50b having respectively a first polarity and a second polarity different from the first polarity. The first and the second polarities refer to the n-type and p-type material. The first and the second interleaved combs 50a, 50b may refer respectively to a Hole Transport Layer (HTL) and an Electron Transport Layer (ETL).

The p-type layer or HTL may be made for example of one among the following elements:
Nickel oxide "$NiO_x$",
Mobyldenum oxide "$MoO_x$",
Tungsten oxide "$WO_x$",
2,2',7,7'-Tetrakis-(N,N-di-4-methoxyphenylamino)-9,9'-spirobifluorene "Spiro-OMeTAD",
poly(triarylamine) "PTAA",
poly(3-hexylthiophene) "P3HT",
poly(3,4-ethylenedioxythiophene) doped with poly(styrene sulfonate) "PEDOT:PSS",
Copper(I) thiocyanate "CuSCN",
Cobalt oxide "$CoO_x$",
Chromium oxide "$CrO_x$",
Copper(I) iodide "CuI",
Copper sulfide"CuS",
Copper oxide "$CuO_x$",
Vanadium oxide "$Vo_x$", The n-type layer or ETL may be made for example of one among the following elements
Tin oxide "$SnO_x$",
Titanium oxide "$TiO_x$",
Zinc oxide "$ZnO_x$"
carbon, $C_{60}$ and derivatives
Zirconia "$ZrO_x$"
graphite
graphene
graphene oxide "rGO".

The front contacts 5a, 5b also comprise a thin conductive layer 51a, 51b made of a transparent conductive oxide such as indium tin oxide (ITO) or fluorine doped tin oxide (FTO) or a metallic layer such as a silver layer. The thin conductive layer 51a, 51b is disposed respectively on the font side of the first and second interleaved combs 50a, 50b.

The first absorbing layer 7 is made of a compound having a perovskite crystalline structure. In this invention the term "perovskite" refers to a material which may be represented by the formula 'A' 'B' 'X'3, wherein 'A' is at least one cation, 'B' is at least one cation, and 'X' is at least one anion. The cation 'A' can be organic, inorganic, or an organic-inorganic cation. When the cation 'A' is organic, the organic cation can have the formula $(R1R2R3R4N)n+$ or $(R5R6N=CH-NR7R8)n+$, where R is hydrogen, unsubstituted or substituted alkyl, or unsubstituted or substituted aryl, and n is equal or superior to one (e.g. 'CH3NH3'+ refers as MA, 'HC(NH2)2'+ refers as FA, 'C(NH2)3'+ refers as GA). When the cation 'A' is inorganic, the cation can be selected from the group consisting of Ag+, Li+, Na+, K+, Rb+, Cs+, Be2+, Mg2+, Ca2+, Pb2+, Sr2+, Ba2+, Fe2+, Sc3+, Y3+, and La3+. The cation can be used as a single or multiple ion (e.g. (Mg,Fe)SiO3), YBaCuO3).

When the cation 'A' is organic-inorganic, the cation can be used as a single or multiple ion such as 'A'=(M1n(R21-xR3x) (100-n)), where R is preferably an organic cation as described above and M is preferably an inorganic cation comprised as described above (e.g. FA1-xGax'B' 'X'3, Csx(MAnFA1-n) (100-x) 'B''X'3).

The cation 'B' can be a metal cation selected from the group consisting of Pb2+, Sn2+, Ge2+, Bi2+, Cu2+, Au2+, Ag2+, Sb2+, Nb2+, Ti2+, Mg2+, Si2+, Ca2+, Sr2+, Cd2+, Ni2+, Mn2+, Fe2+, Zr4+, Co2+, Pd2+, Yb2+, Eu2+, Ce4+, and Tb4+.

The anion 'X' can be selected from the group consisting of halide anions comprising Cl—, Br—, I—, F—, or chalcogenide anions comprising O2-, S2-, Se2-, Te2-, or polyanions comprising BF4-, PF6-, SCN—. The anion can be used as a single or multiple ions such as 'X'=(R1-xRx), where R is an anion as listed above. The invention also includes other type of perovskites that can be elaborated: Cuprate perovskite (La2-xBaxCuO4, YBa2Cu3O7, Ba2MCu3O7, where M is a rare earth ion such as Pr, Y, Nd, Sm, Gd, Dy, Ho). Metal perovskite can be produced based on a RT3M structure, where R is a rare-earth ion, T is a transition metal ion (Pd, Rh, Ru) and M is a light metalloid (e.g. B, C).

The definition above on the range of materials thus includes, but is not limited to, the following compounds: CH3NH3PbX3, Csx(CH3(NH2)2)1-xPbX3, Csx((CH3NH3)y(CH3(NH2)2)1-y)(1-x)PbX3, AxCsy((CH3NH3)z(CH3(NH2)2)1-z)1-yPbX3 where A is an alkali metal (Li, Na, K, Rb), BaTiO3, PbTiO3, CaTiO3, SrTiO3, PbZrO3, SrTiO3, KTaO3, KNbO3, NaNbO3, Pb(Mg⅓Nb⅔)O3, Pb(Zn⅓Nb⅔)O3, Pb(Mn⅓Sb⅔)O3, Pb(Co⅓Nb⅔)O3, Pb(Mn⅓Nb⅔)O3, Pb(Ni⅓Nb⅔)O3, Pb(Sb½Sn½)O3, Pb(Co½W½)O3, Pb(Mg½W½)O3, LiNbO3, LiTaO3, BiTiO3, NaTiO3, NaNbO3, KNbO3, La1-xSrxMnO3, La2NiO4, La2CoO4, GdBaCo2O5, PrBaCo2O5, NdBa1-xSrxCoO2O5, Ba1-xSrxCo1-yFeyO3, BiCr1-xGaxO3, NaNbO3, KNbO3, LaFeO3, LaCoxFe1-xO3, La1-xSrxCoO3, LaSrNiO4, LaxSrx-1FeyBiy-1O3, La2NiO4, La1-xSrxCuO4, LaSrNi1-xAlxO4, LaMnO3, LaFeO3, LaCoO3, LaTi1-xCuxO3, LiTaO3, NaTaO3, KTaO3, CaTa2O6, SrTa2O6, BaTa2O6, (La1-xSrxCoO3, Pr1-xSrxCoO3, Sm1-xSrxCoO3, Gd1-xSrxCoO3, Tb1-xSrxCoO3, LaCoO3, La1-xSrxMnO3, LaCo1-xNixO3).

According to the first embodiment represented in FIG. 1, the interface layer 9 may refer to a tunnel junction layer 9.

The tunnel junction layer 9 comprises a first semi-conductor sub-layer 9a doped according to the first polarity and a second semi-conductor sub-layer 9b highly doped according to the second polarity.

The first sub-layer 9a is for example a p-type layer made of nickel oxide ($NiO_x$), molybdenum oxide ($MoO_x$) or tungsten oxide ($WO_x$).

The second sub-layer 9b is for example an n-type layer made of crystalline silicon and highly doped according to the second polarity, for example with boron or phosphorus doping.

Figure 2:
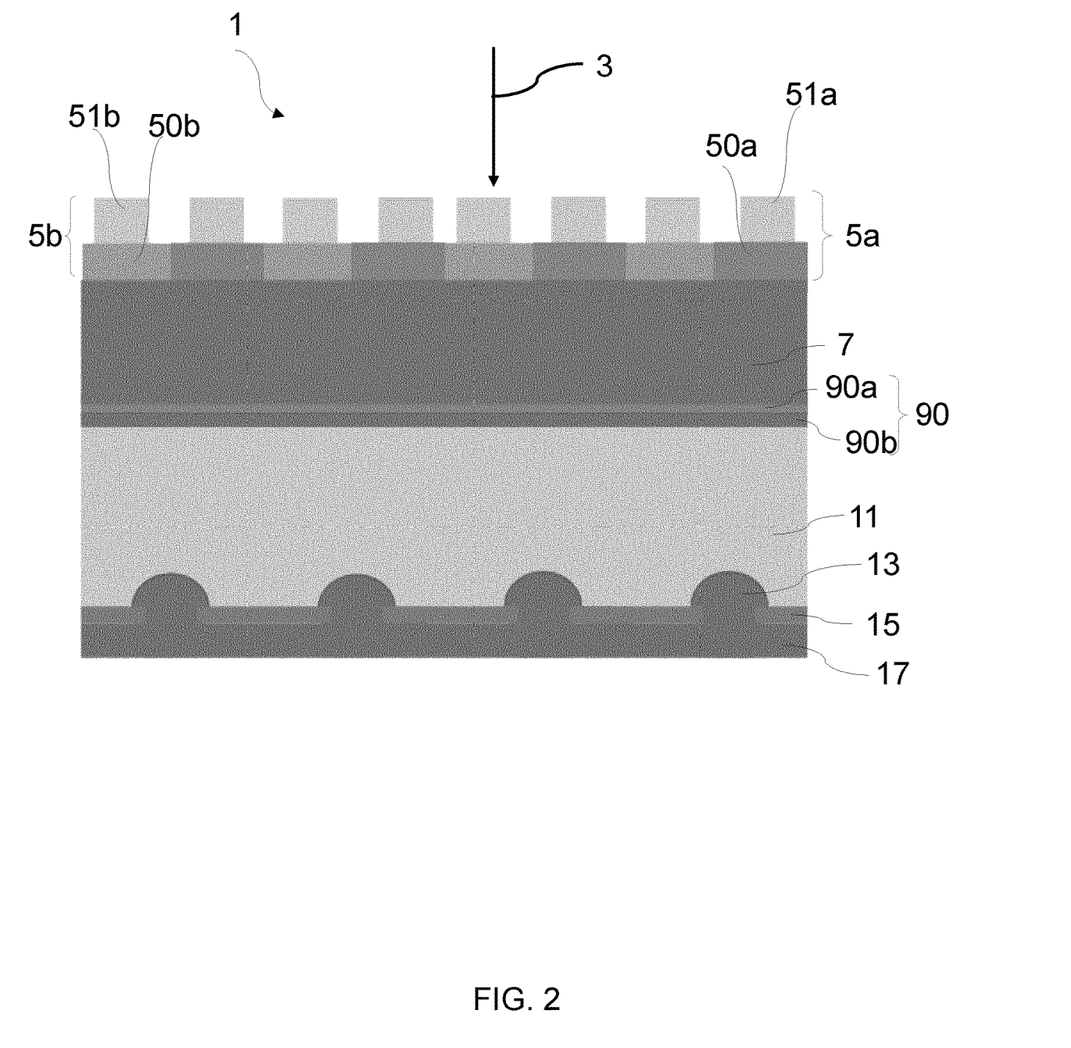
FIG. 2 is a diagram of a three terminal tandem solar generation unit according to a second embodiment of the invention.

According to a second embodiment represented in FIG. 2, the interface layer 90 refers to recombination layer 90. The recombination layer 90 comprises a first semi-conductor sub-layer 90a made of a transparent conductive oxide doped according to the first polarity and a second semi-conductor sub-layer 90b made of a transparent conductive oxide doped according to the second polarity. The other layers remain identical in the first and the second embodiments.

In the embodiments of FIG. 1 and FIG. 2, the second absorbing layer 11 has the first polarity. The second absorbing layer 11 is made of crystalline silicon or of an alloy among the following alloys:
a III-V semiconductor alloy,
a compound having a perovskite type crystalline structure as described previously for the first absorbing layer 7,
Copper Indium Gallium Selenide (CIGS),
Cadmium Telluride (CdTe).

The back surface field layer 13 may be made of aluminium.

The passivation layer 15 may be made of Aluminium oxide/silicon nitride ($AlO_x/SiN_x$) or silicon oxide/silicon nitride ($SiO_x/SiN_x$).

The back contact layer 17 may be made of aluminium and may be obtain by screen printing.

It has to be noted that texturing can be achieved on the different layers of the tandem solar generation unit (front textured, back-textured or inside textured). All the contacts can be passivated and the tunnel junction layer 9 or the recombination layer 90 may comprise additional layers. However, with a first absorbing layer made of perovskite, it is possible to do without passivation of the front contacts.

Figure 3:
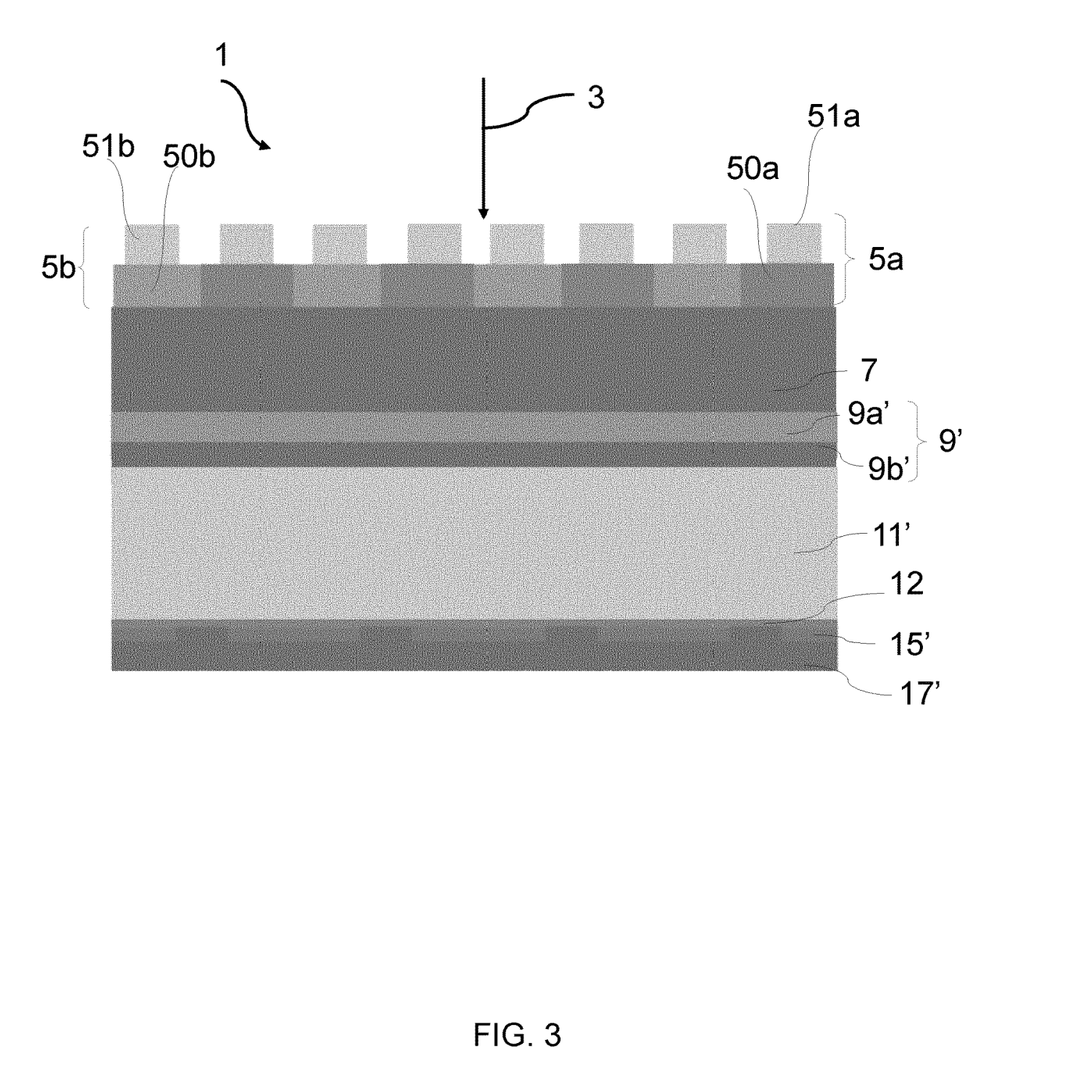
FIG. 3 is a diagram of a three terminal tandem solar generation unit according to a third embodiment of the invention.

FIG. 3 represents a third embodiment of the tandem solar generation unit.

In this third embodiment, the tandem solar generation unit 1 comprises the following layers:
- interdigitated front contacts 5a and 5b,
- a first absorbing layer 7,
- an interface layer 9' arranged on the back side of the first absorbing layer 7,
- a second absorbing layer 11' arranged on the back side of the interface layer 9',
- an emitter layer 12,
- a passivation layer 15',
- a back contact layer 17'.

In this embodiment, the interdigitated front contacts 5a and 5b and the first absorbing layer 7 may be identical to the first and second embodiments represented in FIG. 1 and FIG. 2.

The interface layer is a tunnel junction layer 9' and comprises a first semi-conductor sub-layer 9a' doped according to the second polarity (n-type) and a second semi-conductor sub-layer 9b' highly doped according to the first polarity (p-type).

The first sub-layer 9a' is for example made of tin oxide ($SnO_x$), titanium oxide ($TiO_x$) or zinc oxide ($ZnO_x$).

The second sub-layer 9b' is for example made of highly doped crystalline silicon.

Figure 4:
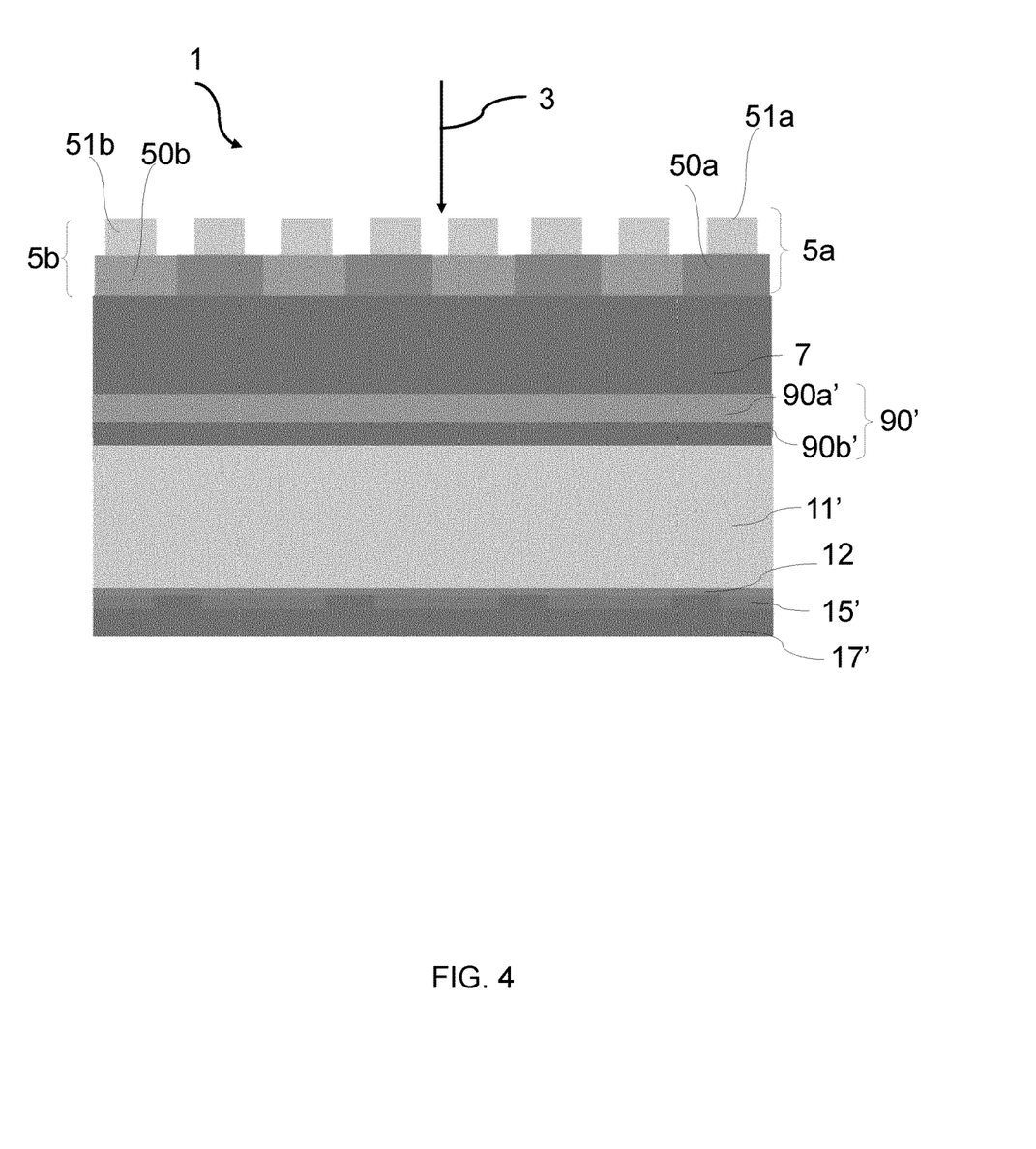
FIG. 4 is a diagram of a three terminal tandem solar generation unit according to a fourth embodiment of the invention.

According to a fourth embodiment represented in FIG. 4, the interface layer is a recombination layer 90' comprising a first semi-conductor sub-layer 90a' made of a transparent conductive oxide doped according to the first polarity and a second semi-conductor sub-layer 90b' made of a transparent conductive oxide doped according to the second polarity. The other layers remain identical in the third and the fourth embodiments.

In the embodiments of FIG. 3 and FIG. 4, the second absorbing layer 11' has the second polarity (n-type). The second absorbing layer 11' is for example made of crystalline silicon or perovskite or copper indium gallium selenide (CIGS) or cadmium telluride (CdTe).

The emitter layer 12 doped according to the first polarity. The emitter layer 12 is for example made of boron.

The passivation layer 15' made of Aluminium oxide/silicon nitride ($AlO_x/SiN_x$) or silicon oxide/silicon nitride ($SiO_x/SiN_x$).

The back contact layer 17' made for example of aluminium. The back contact layer 17' may also comprise a percentage of silicon and can be obtained by phase vapor deposition (PVD).

Thus, the tandem solar generation unit 1 enables carriers associated with a polarity different than the polarity of the back contact to be transferred from the second absorbing layer to the first absorbing layer to be collected by the front contact having the polarity different than the polarity of the back contact.

In the case of the first and second embodiments represented in FIG. 1 and FIG. 2, the tandem solar generation unit 1 is configured for enabling the carriers associated with the second polarity (electrons) to be transferred from the second absorbing layer to the first absorbing layer to be collected by the front contact associated with the second polarity (n-type).

In the case of the third and fourth embodiments represented in FIG. 3 and FIG. 4, the tandem solar generation unit 1 is configured for enabling the carriers associated with the first polarity (holes) to be transferred from the second absorbing layer to the first absorbing layer to be collected by the front contact associated with the first polarity (p-type).

The features of the first 7 and the second 11, 11' absorbing layers and notably their thickness are chosen such that the current produced by the first absorbing layer 7 and the current produced by the second absorbing layer 11, 11' be approximately the same.

Figure 5:
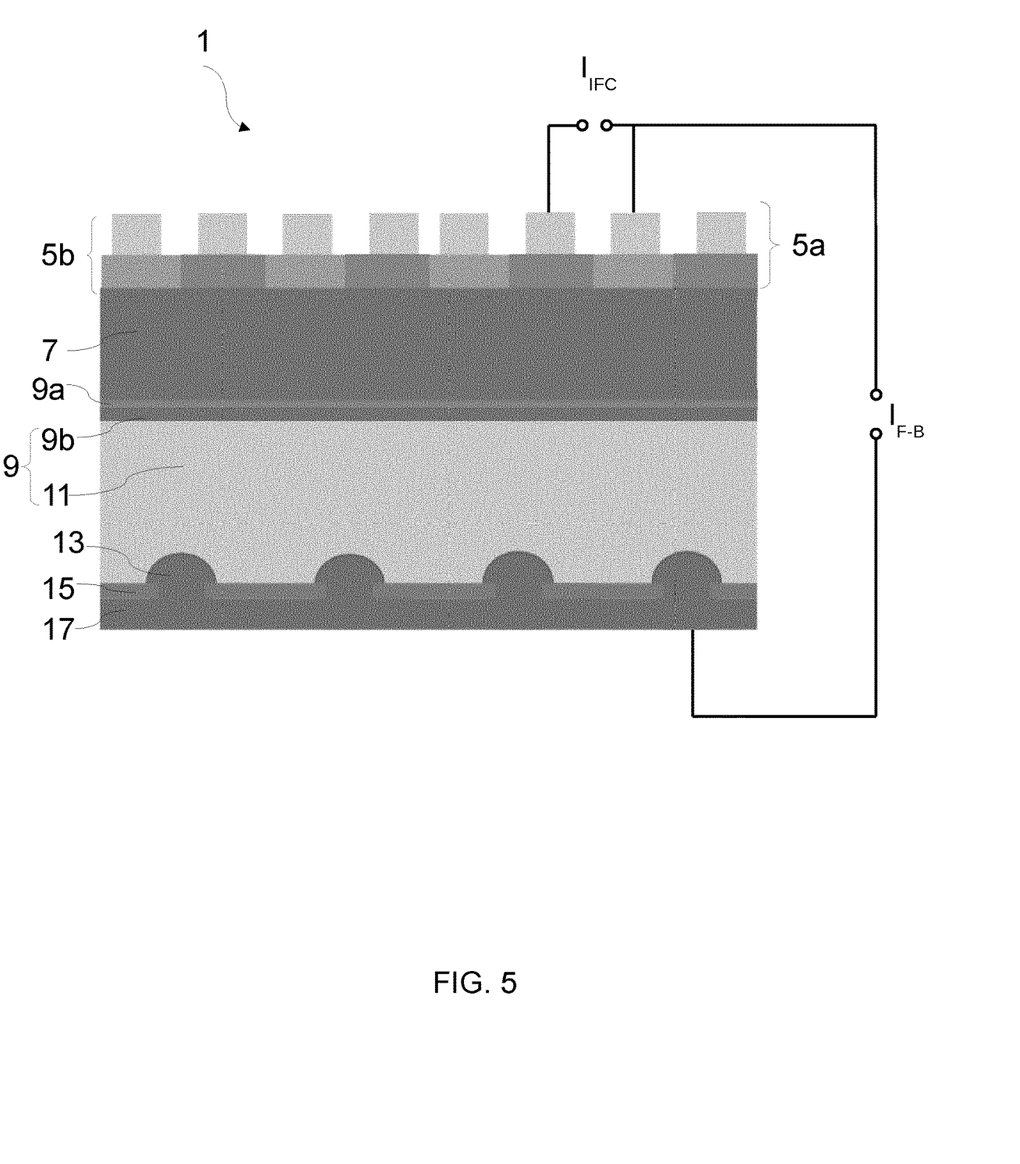
FIG. 5 is a diagram of a three terminal tandem solar generation unit with current measurements.

Furthermore, as represented in FIG. 5, the current $I_{IFC}$ measured between the front contacts 5a, 5b and the current $I_{F-B}$ between the front 5a, 5b and back contacts 17, 17' can be monitored in order to determine if the current produced by the first absorbing layer 7 matches the current produced by the second absorbing layer 11, 11' and for extracting or reinjecting a part of the current ITC in case of a difference or mismatch in order to optimize the overall efficiency of the tandem solar generation unit 1. The present invention also refers to a use or a method for functioning the three terminal tandem solar generation unit 1 wherein the current generated between the first and the second interdigitated front contacts is adjusted so that the current generated by the first absorbing layer 7 matches with the current generated by the second absorbing layer 11, 11'.

Figure 6:
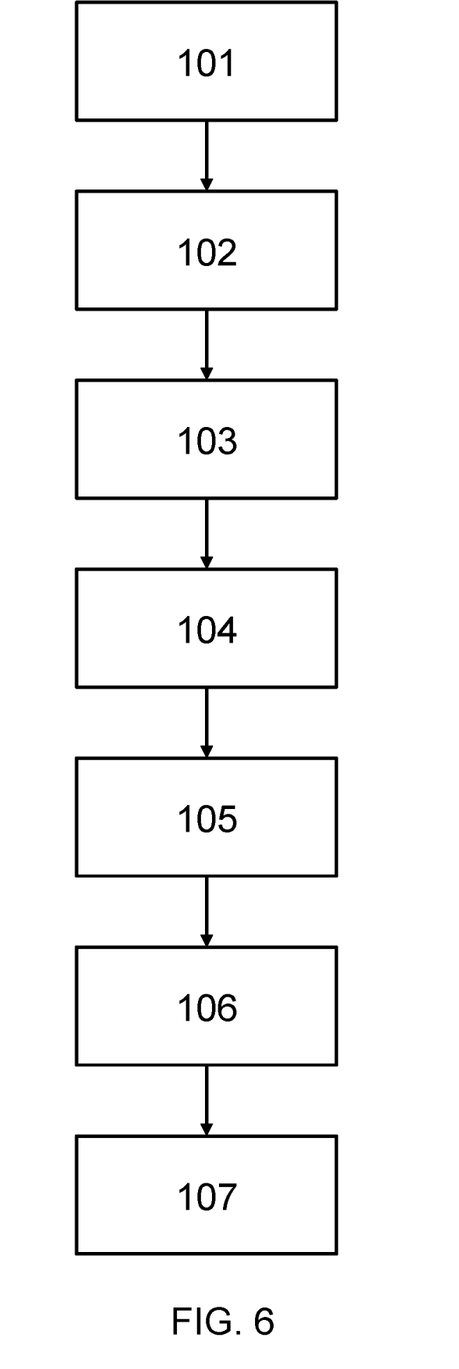
FIG. 6 is a flowchart of the different of a manufacturing process to obtain a three terminal tandem solar generation unit according to a first embodiment of the invention.

FIG. 6 represents a flowchart of the different steps of a manufacturing process according to a first embodiment.

The first step 101 refers to a step of providing a light transparent substrate having a back face and a front face.

The second step 102 refers to a step of depositing a back contact layer 17, 17' having a first or a second polarity on the front face of the substrate. The back contact layer may refer to an aluminium layer and may be deposited according to a phase vapour deposition technique. Alternatively, the aluminium layer may be screen printed. The second step 102 may also refer to a deposition of a passivation layer 15, 15' or an emitter layer 12.

The third step 103 refers to a step of depositing an absorbing layer corresponding to the second absorbing layer 11, 11' on the front side of the back contact layer 17, 17' (or possibly on the front side of a passivation layer 15, 15' or an emitter layer 12.

The fourth step 104 refers to a step of depositing a first highly doped semi-conductive sub-layer 9b, 9b', 90b, 90b' of a tunnel junction on the front side of a second absorbing layer 11, 11'.

The fifth step 105 refers to a step of depositing a second doped semi-conductive sub-layer 9a, 9a', 90a, 90a' of the tunnel junction on the front side of the first sub-layer 9b, 9b', 90b, 90b'.

The sixth step 106 refers to a step of depositing an absorbing layer corresponding to the first absorbing layer 7 made of a compound having a perovskite type crystalline structure on the front side of the second sublayer 9a, 9a', 90a, 90a'.

The seventh step 107 refers to a step of depositing a first and a second interdigitated front contacts 5a, 5b on the front side of the first absorbing layer 7, the first front contact 5a having a first polarity, for example an n-type polarity and the second front contact 5b having a second polarity, for example a p-type polarity.

Figure 7:
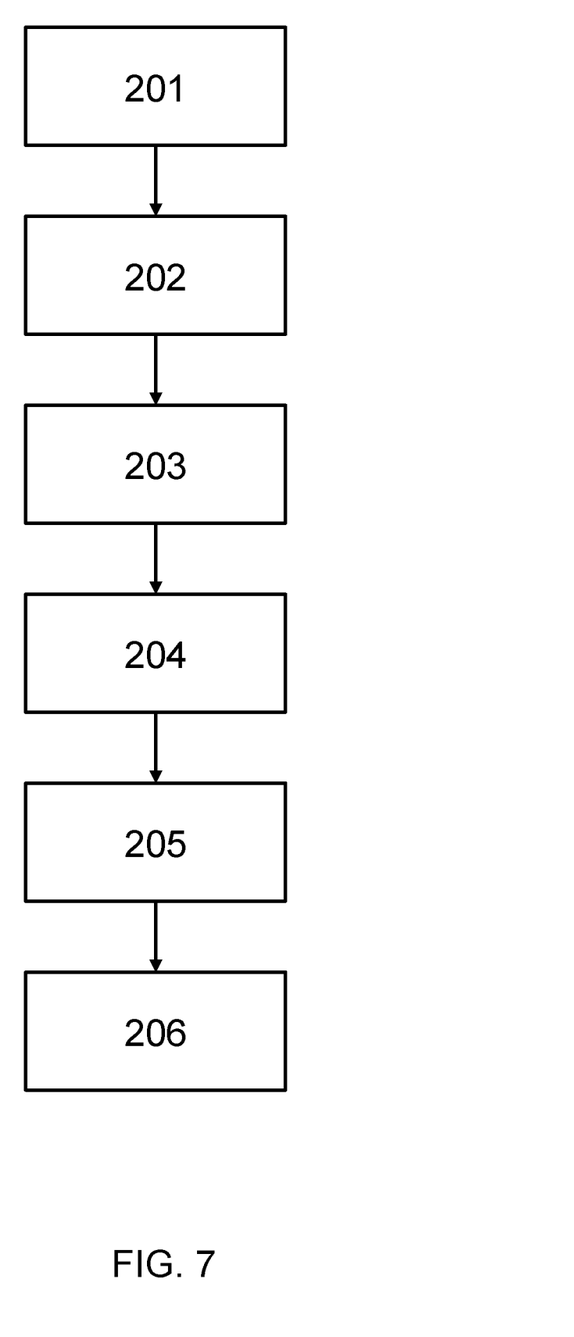
FIG. 7 is a flowchart of the different of a manufacturing process to obtain a three terminal tandem solar generation unit according to a second embodiment of the invention.

FIG. 7 represents a flowchart of the different steps of a manufacturing process according to a second embodiment. In this embodiment, the idea is to modify an existing photovoltaic cell in order to obtain a tandem solar generation unit according to the invention. In particular the existing photovoltaic cell is chosen for its low cost in order to limit the overall cost and the tandem solar generation unit.

The first step 201 refers to a step of providing a crystalline silicon based photovoltaic cell comprising an absorbing layer made from crystalline silicone, a first set of layers arranged on the back side of the crystalline silicone layer, for example back contact layer . . . , and a second set of layers arranged on the front side of the crystalline silicone layer, for example front contact layer . . . . Such photovoltaic cells are mass produced and can be obtained at low prices.

The second step 202 refers to a step of removing the second set of layers of the crystalline silicon photovoltaic cell. Such removing made be made by an etching and/or a polishing process. The etching products may be hydrofluoric acid or a mix of hydrofluoric acid and nitric acid.

The third step 203 refers to a step of depositing a first highly doped semi-conductive sub-layer of a tunnel junction on the front side of the crystalline silicon layer.

The fourth step 204 refers to a step of depositing a second doped semi-conductive sub-layer of the tunnel junction on the first sub-layer.

The fifth step 205 refers to a step of depositing a first absorbing layer made of a compound having a perovskite type crystalline structure on the second sublayer, The sixth step 206 refers to a step of depositing a first and a second interdigitated front contacts on the first absorbing layer, the first front contact having a first polarity and the second front contact having a second polarity.

It has to be noted that other steps and notably the deposition of additional layers may be added to the manufacturing processes disclosed based on FIGS. 6 and 7 without departing from the scope of the present invention.

Thus, the present invention enables obtaining an efficient 3T tandem solar generation unit comprising a front photovoltaic cell coupled in series with a back photovoltaic cell in a tandem generation unit comprising interdigitated front contact enabling the use of available mass produced back cell in order to limit the overall leading to an optimized efficiency/cost ratio.

The invention claimed is:

1. A three terminal tandem solar generation unit comprising:
   a first absorbing layer made of a compound having a perovskite type crystalline structure and comprising a front side and a back side,
   a second absorbing layer comprising a front side and a back side,
   a first and a second interdigitated front contacts arranged on the front side of the first absorbing layer, the first front contact having a first polarity and the second front contact having a second polarity,
   a back contact having the first or the second polarity arranged on the back side of the second absorbing layer,
   an interface layer arranged between the first and the second absorbing layers comprising a first semiconductor sub-layer doped according to the first polarity and a second sub-layer doped according to the second polarity and configured for enabling carriers associated with a polarity different than the polarity of the back contact to be transferred from the second absorbing layer to the first absorbing layer to be collected by the first front contact or second front contact having a polarity different than the polarity of the back contact,
   wherein the first polarity corresponds to the p-type polarity having holes as associated carriers and the second polarity corresponds to the n-type polarity having electrons as associated carriers; and
   wherein the back contact has the first polarity and comprises a back surface field and the second absorbing layer is doped according to the first polarity.

2. The three terminal tandem solar generation unit of claim 1, wherein the interface layer is a tunnel junction layer.

3. The three terminal tandem solar generation unit of claim 1, wherein the interface layer is a recombination layer made of two sublayers of transparent conductive oxides.

4. The three terminal tandem solar generation unit of claim 1, wherein the second absorbing layer is made of crystalline silicon.

5. The three terminal tandem solar generation unit of claim 1, wherein the second absorbing layer is made of one alloy among the following alloys:
   a III-V semiconductor alloy,
   a compound having a perovskite type crystalline structure,
   Copper Indium Gallium Selenide "CIGS", and
   Cadmium Telluride "CdTe".

6. The three terminal tandem solar generation unit of claim 1, wherein the tunnel junction comprises a sub-layer highly doped according to the first polarity and arranged in contact of the front side of the second absorbing layer and a sublayer doped according to the second polarity and arranged in contact of the back side of the first absorbing layer.

7. The three terminal tandem solar generation unit of claim 1, wherein the back contact has the second polarity and the second absorbing layer is doped according to the second polarity.

8. The three terminal tandem solar generation unit of claim 7, wherein the tunnel junction comprises a sub-layer highly doped according to the second polarity and arranged in contact of the front side of the second absorbing layer and a sublayer doped according to the first polarity and arranged in contact of the back side of the first absorbing layer.

9. The three terminal tandem solar generation unit of claim 1, wherein the first front contact, second front contact and back contact are passivated contacts.

10. The three terminal tandem solar generation unit of claim 1, wherein the first and the second front contacts comprise respectively a Hole Transport Layer "HTL" and an Electron Transport Layer "ETL".

11. The three terminal tandem solar generation unit of claim 10, wherein the hole transport layer is made of one among:
   Nickel oxide "NiOx",
   Mobyldenum oxide "MoOx",
   Tungsten oxide "WOx",
   2,2',7,7'-Tetrakis-(N,N-di-4-methoxyphenylamino)-9,9'-spirobifluorene "Spiro-OMeTAD",
   poly(triarylamine) "PTAA",
   poly(3-hexylthiophène) "P3HT",
   poly(3,4-ethylenedioxythiophene) doped with poly(styrene sulfonate) "PEDOT:PSS",
   Copper(I) thiocyanate "CuSCN",
   Cobalt oxide "CoOx",
   Chromium oxide "CrOx",
   Copper(I) iodide "CuI", Copper sulfide "CuS",
Copper oxide "CuOx",
Vanadium oxide "Vox",
and the electron transport layer is made of one among:
Tin oxide "SnOx",
Titanium oxide "TiOx",
Zinc oxide "ZnOx",
carbon, C60 and derivatives,
Zirconia "ZrOx",
graphite,
graphene, and
graphene oxide "rGO".

12. The three terminal tandem solar generation unit of claim 1, wherein the front and back contacts comprise a metallic grid or a transparent conductive oxide grid.

* * * * *